United States Patent
Shiramizu et al.

(10) Patent No.: US 6,726,886 B2
(45) Date of Patent: Apr. 27, 2004

(54) APPARATUS FOR CLEANING SEMICONDUCTOR DEVICE

(75) Inventors: Yoshimi Shiramizu, Tokyo (JP); Mitsuaki Mitama, Tokyo (JP)

(73) Assignees: NEC Electronics Corporation, Kanagawa (JP); Ushio Denki Kabushiki Kaisya, Tokyo (JP)

(*) Notice: Subject to any disclaimer, the term of this patent is extended or adjusted under 35 U.S.C. 154(b) by 109 days.

(21) Appl. No.: 09/888,565

(22) Filed: Jun. 26, 2001

(65) Prior Publication Data

US 2002/0023670 A1 Feb. 28, 2002

Related U.S. Application Data

(62) Division of application No. 09/541,612, filed on Apr. 3, 2000, now Pat. No. 6,277,767.

(30) Foreign Application Priority Data

Apr. 6, 1999 (JP) .......................................... 11-099141

(51) Int. Cl.$^7$ ................................................ B01J 19/08
(52) U.S. Cl. .................................................. 422/186.3
(58) Field of Search .............................. 422/186, 186.3; 134/104.1, 902, 1, 1.3; 438/795, 708, 709, DIG. 906

(56) References Cited

U.S. PATENT DOCUMENTS

| | | | |
|---|---|---|---|
| 5,821,175 A | 10/1998 | Engelsberg | |
| 5,900,305 A | * 5/1999 | Chapman | 428/198 |
| 5,958,268 A | 9/1999 | Engelsberg et al. | |
| 6,015,759 A | * 1/2000 | Khan et al. | 438/707 |
| 6,098,637 A | 8/2000 | Parke | |
| 6,116,254 A | 9/2000 | Shiramizu | |
| 6,124,211 A | 9/2000 | Butterbaugh et al. | |
| 6,143,477 A | * 11/2000 | Rhieu | 430/329 |

FOREIGN PATENT DOCUMENTS

| | | | |
|---|---|---|---|
| JP | 2-49428 | 2/1990 | |
| JP | 6-312130 | 11/1994 | |
| JP | A 8-19766 | 1/1996 | |
| JP | 9-321008 | 12/1997 | |
| JP | 10-154645 A | * 6/1998 | H01L/21/02 |
| JP | A 10-261484 | 9/1998 | |
| JP | 11-10101 | 1/1999 | |

* cited by examiner

Primary Examiner—Evan Pert
(74) Attorney, Agent, or Firm—Young & Thompson

(57) ABSTRACT

A cleaning apparatus for removing organic matters such as phthalates that have deposited on the surface of a semiconductor substrate while restraining the growth of a natural oxide film includes a device for irradiating the semiconductor substrate contaminated by the organic matters. The device emits a vacuum ultraviolet light having a wavelength within a range from 165 to 179 nm in an atmosphere of oxygen or air that is introduced from an $O_2$ or air intake port, thereby decomposing and removing the contaminant.

16 Claims, 4 Drawing Sheets

(a)

(b)

APPARATUS FOR CLEANING SEMICONDUCTOR DEVICE

BACKGROUND OF THE INVENTION

1. Field of the Invention

The present invention relates to a method of cleaning and an apparatus for removing organic matters deposited on a semiconductor substrate in a semiconductor device production process.

2. Description of the Related Art

As semiconductor devices are produced in increasingly higher degrees of integration, the devices are required to have increasingly higher reliability. In the process of forming semiconductor elements on a semiconductor substrate that is carried out in a plurality of film forming steps, in particular, cleanliness of the surface of the underlying semiconductor substrate is a critical factor that determines the reliability.

When forming a gate oxide film or a polysilicon film, it is a common practice to keep the semiconductor substrate in a carrier case made of a plastic material for several hours to several days depending on the operating condition of a film forming apparatus.

However, when kept in the carrier case, the semiconductor substrate is often contaminated by organic matters.

When a gate oxide film, for example, is formed on the surface of a semiconductor substrate that is contaminated by organic matters, it is known that the elements formed thereon are prone to problems such as deterioration in the withstanding voltage.

To remove organic matters deposited on the surface of semiconductor, such a method has been employed as irradiating the surface with vacuum ultraviolet light (wavelength: 254 nm) in an ozone atmosphere. This process has sometimes been carried out at a relatively high temperature of 200° C. or higher.

However, when irradiating the surface with vacuum ultraviolet light (wavelength: 254 nm) in the ozone atmosphere, there has been a problem that a natural oxide film grows on the substrate before the gate oxide film or polysilicon film is formed thereon. There may also occur such a problem that raising the temperature accelerates the growth of the natural oxide film.

The natural oxide film is not of a good nature, and may affect the reliability of the gate oxide film or the polysilicon film to be formed later.

OBJECT AND SUMMARY OF THE INVENTION

To solve such problems as described above, it is an object of the present invention to provide a cleaning method of and a cleaning apparatus for removing organic matters deposited on a semiconductor substrate without allowing the natural oxide film to grow on the semiconductor substrate.

The present invention is directed to a method of cleaning a semiconductor substrate, which comprises removing phthalic acid, phthalate or a derivative thereof deposited on the semiconductor substrate by irradiating the semiconductor substrate with vacuum ultraviolet light having a central wavelength of 172 nm.

The wavelength of vacuum ultraviolet light is preferably within a range from 165 to 179 nm. A light source of vacuum ultraviolet light is preferably a Xe excimer lamp.

The present invention is also directed to an apparatus for cleaning a semiconductor substrate, comprising:

an irradiating means disposed in a closed cleaning chamber for irradiating a semiconductor substrate contaminated by phthalic acid, phthalate or a derivative thereof with vacuum ultraviolet light having a central wavelength of 172 nm;

an intake port for introducing oxygen or air into the cleaning chamber;

a semiconductor substrate charging port for charging the semiconductor substrate into the cleaning chamber while shutting off the atmosphere; and an antechamber of the film forming apparatus through which the semiconductor substrate that has been cleaned in the cleaning chamber is charged into a gate oxide film forming chamber or a polysilicon film forming chamber without being exposed to the atmosphere.

The present invention is further directed to a method of producing a semiconductor device, which comprises effecting a cleaning step as a preliminary step before the step of forming the gate oxide film or the polysilicon film on the semiconductor substrate.

According to the present invention, first, it is made possible to clean the semiconductor substrate that has been kept in a carrier case made of a plastic material and contaminated by phthalic acid, phthalate or a derivative thereof. This is because the irradiation with vacuum ultraviolet light having a wavelength within a range from 165 to 179 nm efficiently generates excited oxygen atoms that decompose the organic matters.

Second, since the cleaning method according to the present invention is effected at a temperature around the room temperature, generation of the natural oxide film can be suppressed.

Third, reliability of the gate oxide film and the polysilicon film can be improved by providing the cleaning step of the present invention immediately before the step of forming the gate oxide film or the polysilicon film.

DETAILED DESCRIPTION OF THE INVENTION

Figure 1:
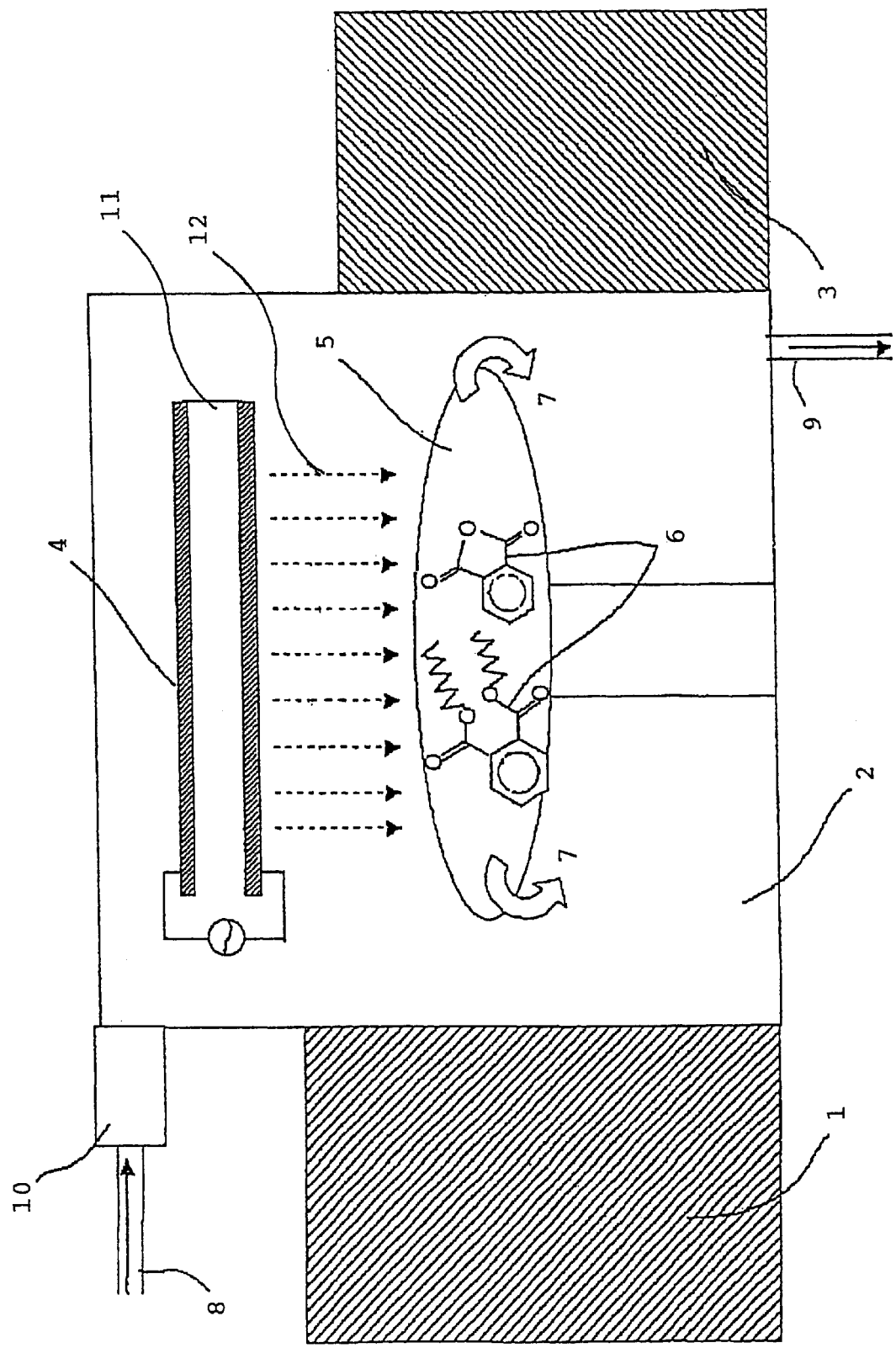
FIG. 1 is a schematic diagram showing a cleaning apparatus that cleans a semiconductor substrate by irradiating the surface thereof with vacuum ultraviolet light (emitted by a Xe exciter lamp oscillating at a wavelength of 172 nm) according to one embodiment of the present invention.

The present inventors of the present application took notice of the fact that a semiconductor substrate kept in a carrier case made of a plastic material is contaminated by organic matters on the surface thereof, and analyzed the surface of the contaminated substrate. The analysis showed that the contaminants are mostly phthalic acid, phthalate or a derivative thereof. These contaminants are supposed to be mainly a plasticizer or an antioxidant included in the plastic carrier case that gasified and deposited on the surface.

The cleaning method of the present invention is best suited for removing especially the organic matter described above, and may be considered to be a method that minimizes the growth of the natural oxide film.

Now the mechanism of cleaning will be described below.

Prior art of removing organic matters in general includes one that employs UV/ozone gas, wherein vacuum ultraviolet light of wavelengths 254 nm, 185 nm, etc. emitted by a low pressure mercury lamp are used. When UV light (wavelengths 254 nm, 185 nm, etc.) is emitted in an $O_3$ atmosphere, $O_2$ molecules in the air decompose, form ozone and further decompose into excited oxygen atoms in the reactions expressed by the scheme (1).

Scheme 1

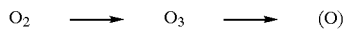

The cleaning method according to the present invention, on the other hand, comprises two reaction paths, one expressed by the scheme 2 where $O_2$ molecules in the air are decomposed directly into excited oxygen atoms by vacuum ultraviolet light (emitted by a Xe excimer lamp oscillating at a wavelength of 172 nm) and one expressed by the scheme 3 where $O_2$ molecules in the air are decomposed to form ozone and further decomposed into excited oxygen atoms.

Scheme 2

Scheme 3

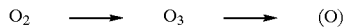

Thus the cleaning method of the present invention can be considered to be a method capable of generating excited oxygen atoms efficiently.

In order to remove the organic matters originating in the carrier case made of a plastic material, namely to achieve the object of the present invention, it is indispensable to generate excited oxygen atoms and therefore it is most advantageous to employ the method of the present invention where the excited oxygen atoms are generated efficiently.

Moreover, the cleaning method of the present invention has such an advantage that it is not necessary to raise the temperature and the processing time is relatively short since the excited oxygen atoms are generated efficiently at a room temperature (0 to 30° C.). This leads to another advantage that the growth of a natural oxide film can be restrained to about 4 to 5 Å.

In the prior art process of irradiating with UV light, on the other hand, since the excited oxygen atoms cannot be generated efficiently, there have been such problems that longer processing time is required, a higher processing temperature is required or, in some cases, the natural oxide film growing rate is higher than the organic matter removing rate and may eventually make it impossible to remove the contaminant.

EXAMPLES

Now the present invention will be described in more detail below with reference to the accompanying drawings.

FIG. 1 is a schematic diagram showing a dry cleaning apparatus that cleans a semiconductor substrate by irradiating the surface with vacuum ultraviolet light (emitted by a Xe excimer lamp oscillating at a wavelength of 172 nm) in an air or $O_2$ atmosphere before forming various films. As shown in this drawing, the cleaning apparatus comprises a semiconductor substrate charging port 3, a cleaning chamber 2, and a film forming apparatus antechamber 1.

This apparatus may be of either single sheet processing type wherein the semiconductor substrates are processed one by one, or batch processing type where a plurality (for example, several to about 25 pieces) of semiconductor substrates are cleaned at the same time.

The cleaning chamber 2 has a space that is closed airtight, with an vacuum ultraviolet light source 4 installed above the cleaning chamber 2 and the semiconductor substrate 5 disposed below the light source.

For the vacuum ultraviolet light source used in the method of cleaning the semiconductor substrate according to the present invention, a xenon excimer lamp emitting light having a central wavelength of 172 nm is preferably used. Since vacuum ultraviolet light have distributed wavelengths, the semiconductor substrate is irradiated with light having a wavelength within a range from 165 to 179 nm.

The semiconductor substrate that has been kept in a carrier case made of a plastic material or exposed in a clean room is contaminated by organic matters 6 on the surface 5. The organic matters 6 comprise mostly phthalic acid, phthalate and a derivative thereof that are included in the plastic carrier case and are deposited on the semiconductor substrate after being evaporated.

As oxygen is introduced into the cleaning chamber 2 and vacuum ultraviolet light (Xe)11 are irradiated from vacuum ultraviolet light source 4, excited oxygen atoms 12 are generated efficiently and decompose the phthalic acid and other contaminants deposited on the surface of the semiconductor substrate 5 that are turned into decomposed matters 7 such as carbon dioxide, water and carbon compounds of low molecular weights. The decomposed matters 7 are purged out of the apparatus through an exhaust port 9.

Oxygen introduced into the cleaning chamber may be a gas that includes oxygen, and may be introduced together with a carrier gas that is not depositable nor corrosive to the semiconductor substrate. From economical consideration, it is preferable to use high purity oxygen or clean air that has passed a filter 10 to remove impurities such as particles, organic matters and ammonia.

In the drawing, oxygen or air introduced through the air intake port 8 passes a 3-layer filter 10 consisting of an ULPA filter element, an organic matter removing filter element and an ammonia removing filter element, and enters the cleaning chamber 2. The ULPA filter element is a glass filter that removes particles, and the organic matter removing filter element and the ammonia removing filter element are chemical filters consisting of active carbons or ion exchange resins of different kinds.

While there is no limitation to the cleaning temperature, processing at a temperature within a range from 0 to 30° C. has such an advantage that the growth of natural oxide film does not increase. In FIG. 1, process temperature and humidity are set similar to those in the closed clean room without need to raise the temperature during irradiation and, since the temperature is not increased by irradiation, the process proceeds around the room temperature.

The semiconductor substrate charging port 3 is a space isolated from the clean room except for a time when the contaminated semiconductor substrate is charged, thereby minimizing the possibility of contaminating the cleaning room.

The semiconductor substrate 5 that has been cleaned in the cleaning room 2 is transferred to the film forming apparatus antechamber 1 while being isolated from the clean room atmosphere, and is then sent to a gate oxide film forming step or a polysilicon film forming step that is a subsequent step. The film forming apparatus antechamber 1 is an antechamber for transferring the semiconductor substrate 5 to the gate oxide film forming chamber or the polysilicon film forming chamber while isolating the semiconductor substrate from the atmosphere. Such a configuration of the apparatus makes it possible to improve the reliability of the films and improve the yield of producing the semiconductor devices, since the gate oxide film or the polysilicon film is formed with a degree of cleanliness being maintained.

Figure 2:
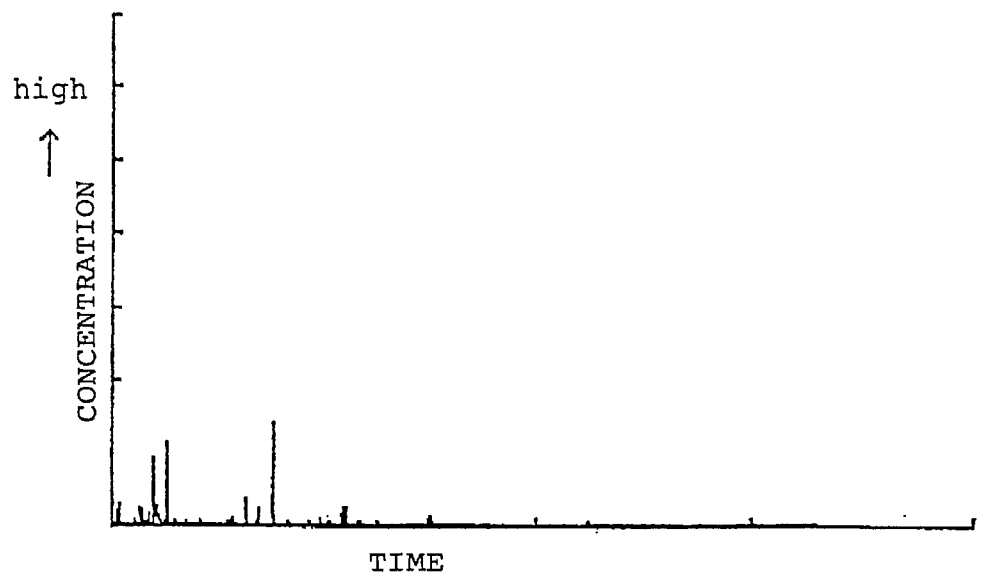
FIG. 2 shows the results of analyses conducted with a gas chromatograph mass spectrometer of high temperature desorption type on residual organic matters deposited on the surface of a semiconductor substrate before and after cleaning by the cleaning method of the present invention (FIG. 2a showing the result after cleaning and FIG. 2b showing the result before cleaning).
Figure 2:
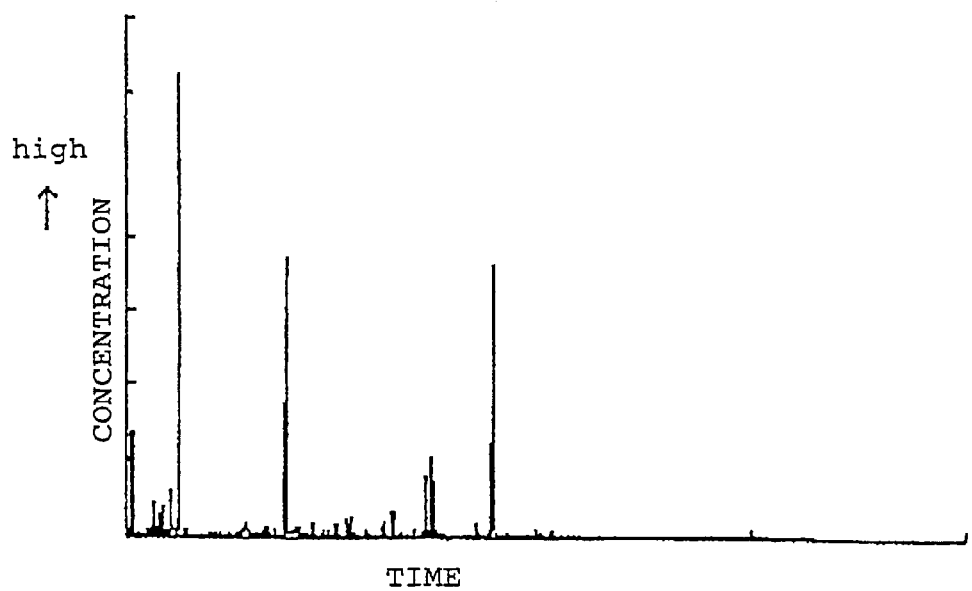

FIGS. 2-a, 2-b show the results of evaluating the residual organic matters deposited on the surface of a semiconductor substrate before and after cleaning by the cleaning method of the present invention (irradiation of vacuum ultraviolet light for 5 seconds), measuring with a gas chromatograph mass spectrometer of high temperature desorption type (FIG. 2a showing the result after cleaning and FIG. 2b showing the result before cleaning).

In FIGS. 2-a and 2-b, concentration represented in ionic strength is plotted along the ordinate and retention time of the chromatograph is plotted along the abscissa. Both graphs show the results of measurements in the same scale to facilitate relative evaluation. The greater the number of peaks, the greater the variety of the organic matters deposited. Height of a peak represents the amount of the organic matter deposited.

Comparison of the graphs in FIGS. 2-a, 2-b shows high cleaning effect of the cleaning method according to the present invention. It is also found that density of the organic matters deposited decreases to a satisfactory level of within 0.1 ng/cm$^2$ after cleaning.

Figure 3:
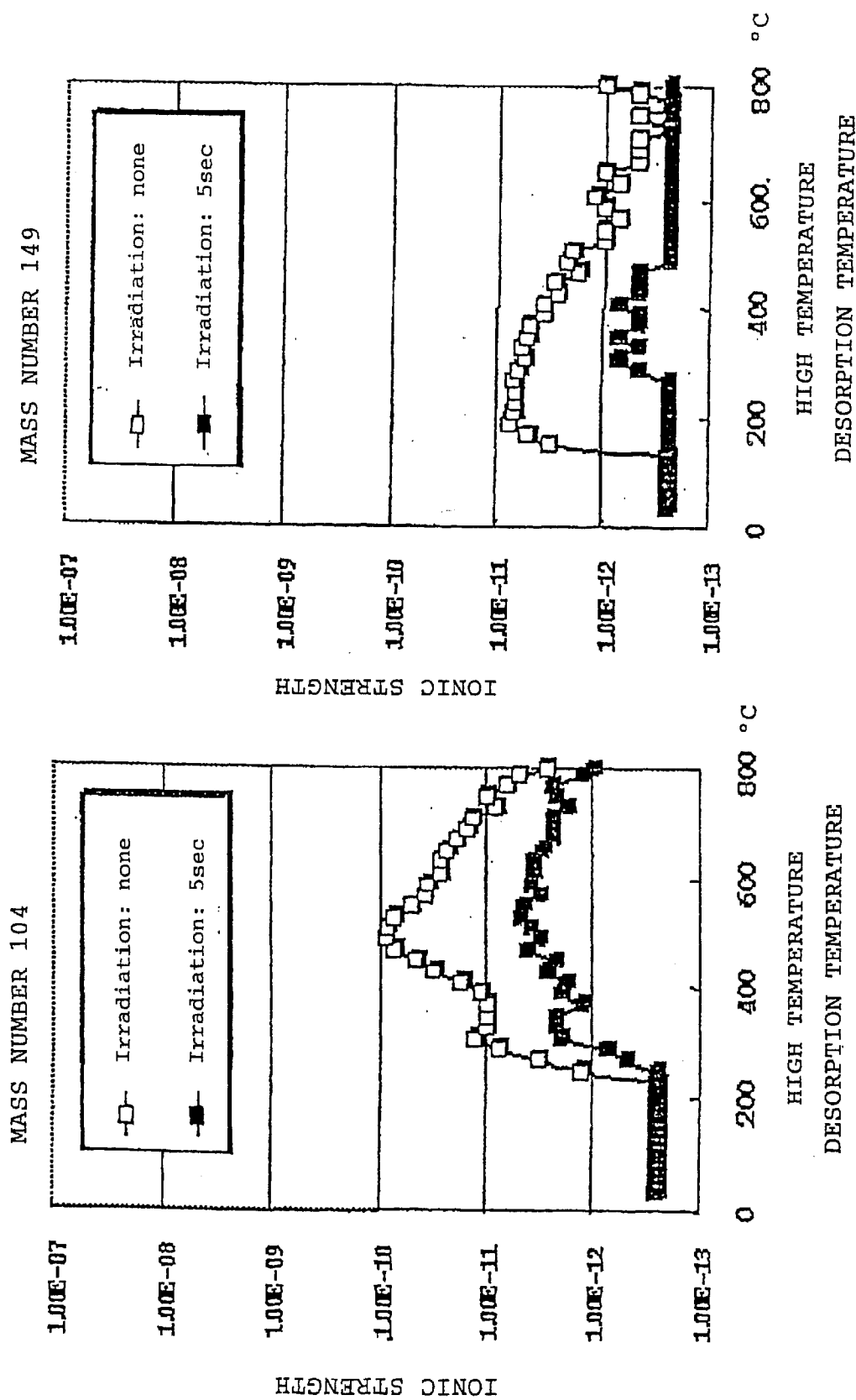
FIG. 3 shows the results of analyses conducted with an atmospheric pressure mass spectrometer of high temperature desorption type on phthalate deposited on the surface of a semiconductor substrate before and after cleaning by the cleaning method of the present invention.

FIG. 3 shows the results of detailed evaluation conducted with an atmospheric pressure mass spectrometer of high temperature desorption type on phthalate (used as the plasticizer in the plastic carrier case) among the organic matters deposited on the surface of the semiconductor substrate. Concentration represented in ionic strength is plotted along the ordinate and desorption temperature is plotted along the abscissa. The graph on the right-hand side of FIG. 3 shows the case of mass number 149 (main peak of phthalic acid) and the graph on the left-hand side shows the case of mass number 104 (skeleton of phthalic acid).

In either graph, it suffices to compare the behavior in a temperature range from about 400 to 600° C., and it is shown that phthalate decreases by more than one order of magnitude in terms of ionic strength.

Figure 4:
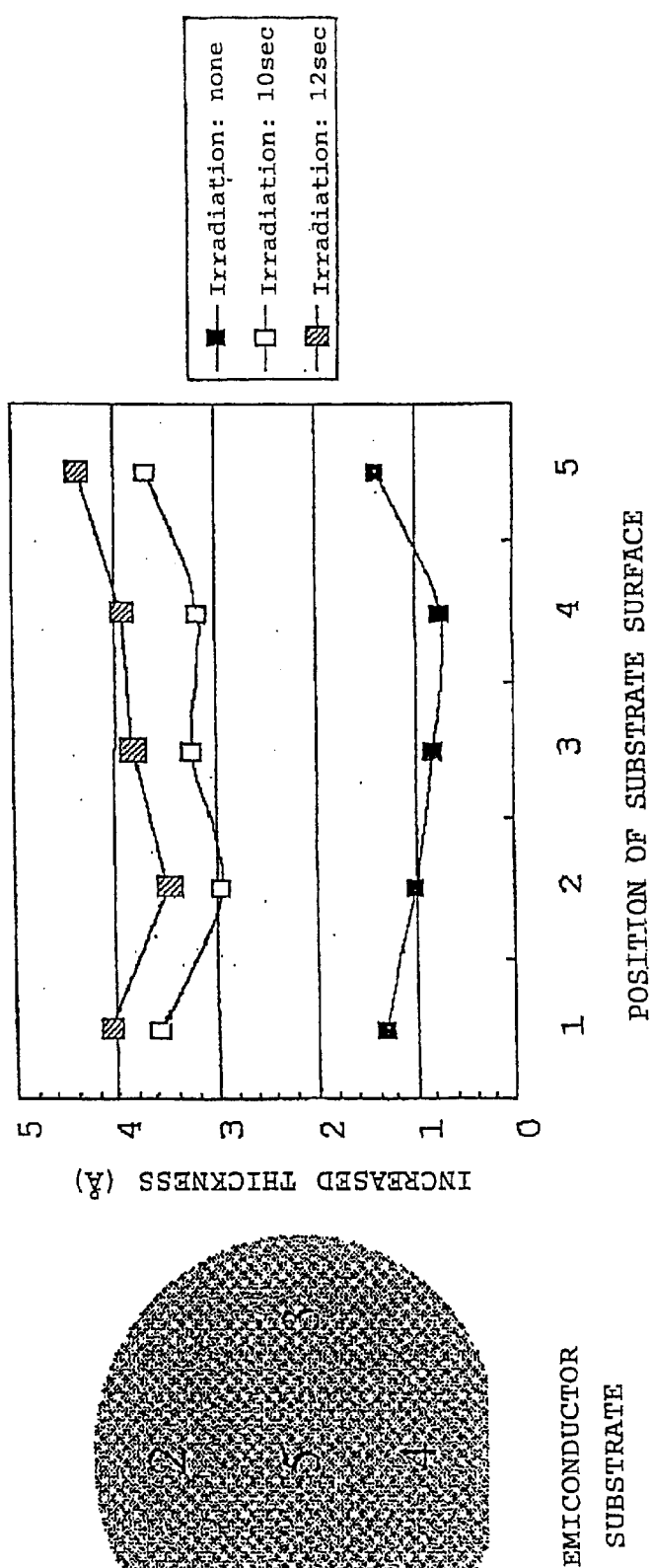
FIG. 4 shows the results of evaluating the amount of increase in the natural oxide film in the case of cleaning by the cleaning method of the present invention.

Then changes in the thickness of the natural oxide film was measured before and after irradiating with vacuum ultraviolet light (emitted by a Xe excimer lamp oscillating at wavelength 172 nm) and when the irradiation time was elongated in case the cleaning method of the present invention was employed. The results are shown in FIG. 4. The film thickness was measured at five points on the semiconductor substrate as shown in FIG. 4.

It was found that a longer irradiation time (120 seconds at maximum) causes the thickness of natural oxide film to increase, while the increase in the thickness of natural oxide film is at a satisfactory level of about 3 to 4 Å (amount of increase 1 Å without irradiation) with irradiation time of about 120 seconds.

What is claimed is:

1. An apparatus for cleaning a semiconductor substrate, comprising:
   a closed cleaning chamber having means for maintaining a temperature of a semiconductor substrate between 0° and 30° C. when the substrate is in the chamber and the chamber is operating to clean the substrate;
   a vacuum ultraviolet lamp disposed in said cleaning chamber for irradiating a semiconductor substrate contaminated by phthalic acid, phthalate or a derivative thereof with vacuum ultraviolet light having a central wavelength of 172 nm; and
   an intake port for introducing gas at least including oxygen into said cleaning chamber.

2. The apparatus of claim 1, further comprising:
   an exhaust port for purging out decomposed matters generated by a reaction of contaminants at a surface of said semiconductor substrate with excited oxygen atoms, said excited oxygen atoms generated by irradiation of said vacuum ultraviolet light to said gas.

3. The apparatus of claim 1, further comprising:
   a filter for cleaning said gas, and said filter connected between said intake port and said closed cleaning chamber.

4. The apparatus of claim 3, wherein said filter comprises:
   a glass filter for removing particles, and a chemical filter for removing organic matter and ammonia.

5. The apparatus of claim 1, wherein said vacuum ultraviolet lamp comprises a Xe excimer lamp.

6. The apparatus of claim 1, wherein a wavelength of said vacuum ultraviolet light is within a range from 165 to 179 nm.

7. The apparatus of claim 1, further comprising:
   a semiconductor substrate inputting port for inputting said semiconductor substrate into said cleaning chamber while shutting off the atmosphere.

8. The apparatus of claim 1, further comprising:
   an antechamber for transferring said semiconductor substrate from said cleaning chamber to a film forming chamber without exposing said semiconductor substrate to the atmosphere.

9. An apparatus for cleaning a semiconductor substrate, comprising:
   a cleaning chamber having means for maintaining a temperature of a semiconductor substrate between 0° and 30° C. when the substrate is in the chamber and the chamber is operating to clean the substrate;
   an intake port connected to said cleaning chamber, and introducing gas at least including oxygen into said cleaning chamber;
   a vacuum ultraviolet lamp disposed in said cleaning chamber for irradiating a contaminated semiconductor substrate with vacuum ultraviolet light; and
   an exhaust port for purging out decomposed matters from a surface of said contaminated semiconductor substrate.

10. The apparatus of claim 9, further comprising:
    a cleaning filter; and
    wherein said intake port is connected to said cleaning chamber via said cleaning filter.

11. The apparatus of claim 10, wherein said cleaning filter comprises:

a glass filter for removing particles.

12. The apparatus of claim 10, wherein said cleaning filter comprises:

a chemical filter for removing organic matter and ammonia.

13. The apparatus of claim 11, wherein said cleaning filter further comprises:

a chemical filter for removing organic matter and ammonia.

14. The apparatus of claim 12, wherein said chemical filter comprises:

a first filter layer for removing said organic matter and a second filter layer for removing said ammonia.

15. The apparatus of claim 13, wherein said chemical filter comprises:

a first filter layer for removing said organic matter and a second filter layer for removing said ammonia.

16. An apparatus for cleaning a semiconductor substrate, comprising:

a closed cleaning chamber having means for maintaining a temperature of a semiconductor substrate between 0° and 30° C. when the substrate is in the chamber and the chamber is operating to clean the substrate;

an irradiating means disposed in said closed cleaning chamber for irradiating a semiconductor substrate contaminated by phthalic acid, phthalate or a derivative thereof with vacuum ultraviolet light having a central wavelength of 172 nm;

an intake port for introducing oxygen or air into the cleaning chamber;

a semiconductor substrate charging port for charging the semiconductor substrate into the cleaning chamber while shutting off the atmosphere; and an antechamber of the film forming apparatus through which the semiconductor substrate that has been cleaned in the cleaning chamber is charged into a gate oxide film forming chamber or a polysilicon film forming chamber without being exposed to the atmosphere.

* * * * *